US 9,427,776 B2

(12) United States Patent
Gooch et al.

(10) Patent No.: US 9,427,776 B2
(45) Date of Patent: Aug. 30, 2016

(54) METHOD OF STRESS RELIEF IN ANTI-REFLECTIVE COATED CAP WAFERS FOR WAFER LEVEL PACKAGED INFRARED FOCAL PLANE ARRAYS

(71) Applicant: Raytheon Company, Waltham, MA (US)

(72) Inventors: Roland W. Gooch, Dallas, TX (US); Buu Q. Diep, Murphy, TX (US); Stephen H. Black, Buellton, CA (US); Thomas A. Kocian, Dallas, TX (US); Adam M. Kennedy, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 636 days.

(21) Appl. No.: 13/688,714

(22) Filed: Nov. 29, 2012

(65) Prior Publication Data
US 2014/0053966 A1 Feb. 27, 2014

Related U.S. Application Data

(60) Provisional application No. 61/692,491, filed on Aug. 23, 2012.

(51) Int. Cl.
*B05D 5/06* (2006.01)
*B81B 7/00* (2006.01)
*B81C 1/00* (2006.01)

(52) U.S. Cl.
CPC ............. *B05D 5/061* (2013.01); *B81B 7/0067* (2013.01); *B81C 1/00325* (2013.01); *B81B 2201/0207* (2013.01); *B81C 2203/0118* (2013.01)

(58) Field of Classification Search
CPC ........ B32B 41/00; B81B 7/00; B81B 7/0067; B81B 2201/0207; B81C 1/00; B81C 1/00325; B81C 2203/0118; H01L 27/14618; H01L 31/0203; B05D 5/061
USPC ..................... 156/64; 257/680; 438/116, 944
See application file for complete search history.

(56) References Cited

U.S. PATENT DOCUMENTS

| 5,895,233 A * | 4/1999 | Higashi et al. ............... 438/107 |
| 2005/0063071 A1* | 3/2005 | Wang et al. .................. 359/742 |
| 2005/0184304 A1 | 8/2005 | Gupta et al. |
| 2005/0231713 A1* | 10/2005 | Owen et al. ............... 356/237.1 |
| 2007/0262407 A1 | 11/2007 | Schimert et al. |

FOREIGN PATENT DOCUMENTS

| CN | 101802576 A | 8/2010 |
| EP | 2363887 A1 | 9/2011 |
| JP | 2000337959 A | 12/2000 |
| JP | 2004226127 A | 8/2004 |
| WO | 9517014 A1 | 6/1995 |
| WO | 2009005017 A1 | 1/2009 |

* cited by examiner

*Primary Examiner* — George Koch
(74) *Attorney, Agent, or Firm* — Lando & Anastasi, LLP

(57) ABSTRACT

Methods for reducing wafer bow induced by an anti-reflective coating of a cap wafer are provided. The method may utilize a shadow mask having at least one opening therein that is positioned opposite recessed regions in a cap wafer. The method may further include depositing at least one layer of an anti-reflective coating material through the shadow mask onto a planar side of a cap wafer to provide a discontinuous coating on the planar side.

11 Claims, 7 Drawing Sheets

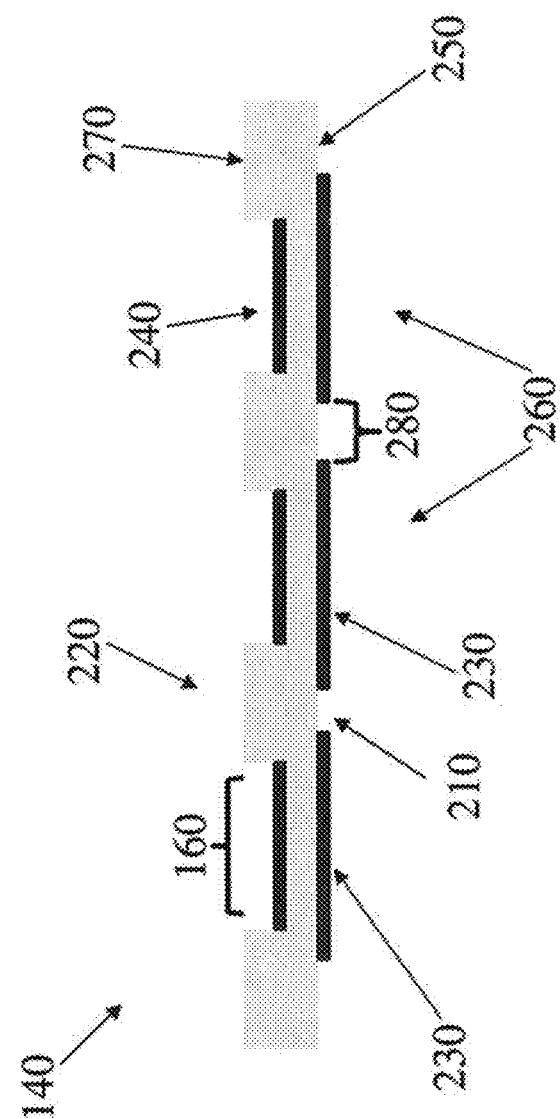

METHOD OF STRESS RELIEF IN ANTI-REFLECTIVE COATED CAP WAFERS FOR WAFER LEVEL PACKAGED INFRARED FOCAL PLANE ARRAYS

BACKGROUND

Microelectromechanical systems (MEMS) is a technology that can generally be described as miniaturized mechanical and electro-mechanical elements that are made using the techniques of microfabrication. The critical physical dimensions of MEMS devices can vary from well below one micrometer (micron) to several millimeters. Likewise, the types of MEMS devices can vary from relatively simple structures lacking any moving elements, to extremely complex electromechanical systems with multiple moving elements that are under the control of integrated microelectronics. Non-limiting examples of MEMS devices include sensors and optical devices, such as single-band or multi-band detector focal plane arrays (FPAs) or microbolometers. FPA devices may include single-band or multi-band integrated FPAs (e.g., single band visible FPA devices, or integrated dual-band FPA devices that are capable of detecting both near infrared (IR) spectrum radiation and visible spectrum radiation).

A microbolometer is an example of a MEMS device that can be used in an FPA. Microbolometers are devices that measure the power of incident electromagnetic radiation by heating material with a temperature-dependent electrical resistance. The resulting increase in temperature correlates to the energy of the absorbed radiation and is measured by a change of the electrical resistance of the bolometer thermistor material. The measurements may be made by any one of a number of temperature sensing techniques, including thermoelectric, pyroelectric, or resistive methods. The term "uncooled infrared bolometers" usually refers to resistive microbolometers where the temperature increase is measured by a change in resistance. These types of microbolometers may be used in commercial and military IR imaging applications.

Microbolometers are often fabricated using integrated circuit fabrication techniques. The basic construction includes a substrate that includes an FPA that comprises a plurality of detector elements that correspond to respective pixels. The substrate contains an integrated circuit which is electrically coupled to the detector elements, and is commonly known as a read out integrated circuit (ROIC). After fabrication, microbolometers are generally placed in vacuum packages to provide an isolated environment for the device. The vacuum package provides an optimal environment for the sensing device, since the presence of gas may impede performance. Alternatively, the bolometer may be packaged in a specific atmosphere comprising one or more gases.

SUMMARY OF INVENTION

Aspects and embodiments relate generally to methods for reducing wafer bow, and more particularly, to reducing wafer bow induced by an anti-reflective coating on a cap wafer.

In accordance with one or more embodiments, a method of reducing wafer bow induced by an anti-reflective coating on a cap wafer is provided. The method comprises providing the cap wafer having a planar side and an opposing cavity side, the cavity side including at least one recessed region and a dividing region on either side of the at least one recessed region, positioning a first shadow mask having at least one opening therein over the planar side of the cap wafer, aligning the first shadow mask such that the at least one opening is positioned opposite the at least one recessed region, and depositing at least one layer of an anti-reflective coating material through the first shadow mask onto the planar side of the cap wafer to provide a discontinuous coating on the planar side.

In a further aspect, the discontinuous coating is dimensioned and configured such that a wafer bow induced by the anti-reflective coating is less than 30 microns for an 8 inch diameter cap wafer. In some aspects, the wafer bow is less than 20 microns.

In at least one aspect, the at least one opening in the first shadow mask is dimensioned to extend appreciably beyond the at least one recessed region on the cap wafer. In a further aspect, the at least one recessed region corresponds to the location of at least one micro-electromechanical system (MEMS) device on a corresponding device wafer.

In certain aspects, the discontinuous coating corresponds to saw streets on the cap wafer. In another aspect, the method further comprises positioning a second shadow mask having at least one opening therein over the cavity side of the cap wafer and aligning the second shadow mask such that the at least one opening is positioned over the at least one recessed region. According to a further aspect, the method further comprises depositing at least one layer of an anti-reflective coating material through the at least one opening in the second shadow mask onto the cavity side of the cap wafer to provide a discontinuous coating on the cavity side. In various aspects, the discontinuous coating on the planar side is dimensioned and configured such that a wafer bow induced by the anti-reflective coating is less than 30 microns for an 8 inch diameter cap wafer. In some aspects, the discontinuous coating on the planar side is dimensioned and configured such that a wafer bow induced by the anti-reflective coating is in balance with a wafer bow induced by the anti-reflective coating on the cavity side. In a further aspect, the method further comprises providing a device wafer onto which at least one MEMS device is formed.

In accordance with a further aspect, the method further comprises positioning the cap wafer over the device wafer such that the cavity side of the cap wafer is facing the at least one MEMS device, aligning the cap wafer to the device wafer such that the at least one recessed region is positioned over the at least one MEMS device, and bonding the cap wafer to the device wafer to create bonding structures.

In at least one aspect, the method further comprises inspecting the bonding structures through inspection regions provided by the discontinuous coating on the planar side of the cap wafer. In certain aspects, the inspection is performed using a charge-coupled device (CCD).

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 2C is a diagram of a side cross-sectional view of a cap wafer coated using a method in accordance with aspects of the invention;

DETAILED DESCRIPTION

Aspects and embodiments are directed toward providing a method for reducing wafer bow induced by an anti-reflective coating. In particular, aspects and embodiments are directed to reducing wafer bow in a cap wafer.

As discussed above, MEMS devices, including microbolometers, are often placed in vacuum packages to provide an isolated environment for the device. For example, a cap wafer may be bonded to an ROTC device wafer, enclosing the sensor device (for example, one or more microbolometers) to provide a protected and sealed environment surrounding the sensor device. Fabrication of the cap wafer may include coating the cap wafer with an anti-reflective (AR) coating. In certain applications, the AR coating may be included on both sides of the cap wafer. As discussed further below, the AR coating may be dimensioned differently on both sides of the wafer, which may induce internal stress in the cap wafer. The internal stress causes the cap wafer to bow or curve, which leads to multiple processing concerns. Accordingly, aspects and embodiments are directed to reducing or eliminating bow in the cap wafer by selectively applying the AR coating, as discussed in more detail below.

Figure 1:
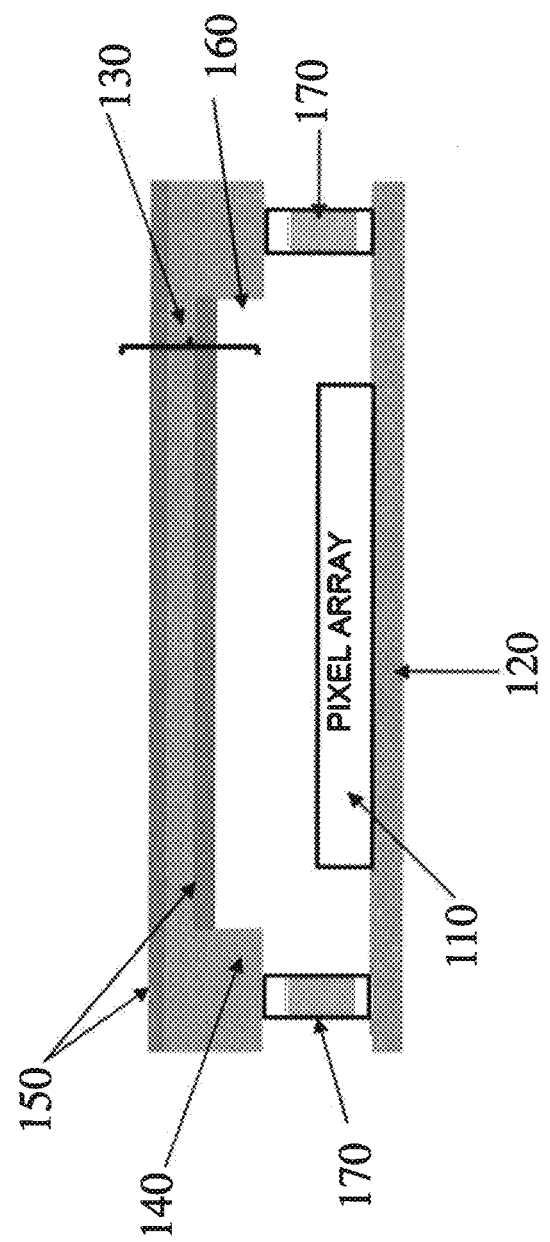
FIG. 1 is a diagram illustrating a side cross-sectional view of a portion of a cap wafer bonded to a portion of a device wafer in accordance with aspects of the invention.

A fully packaged MEMS device comprising a sensor element is illustrated in FIG. 1. As used herein, the terms "micro-electromechanical system" and "MEMS" are used interchangeably, and may refer to any one of a variety of MEMS devices. In the following description, the term "MEMS device" is used as a general term to refer to electromechanical devices, and is not intended to refer to any particular scale of electromechanical devices unless specifically noted otherwise. In at least one embodiment, the MEMS device is an uncooled infrared bolometer FPA.

Referring to FIG. 1, there is illustrated one example of a MEMS device, such as an FPA, including a pixel array 110 formed on an ROTC wafer 120. For purposes related to performance, the device may need to be packaged in a vacuum that includes a reliable hermetic seal and an integrated infrared (IR) window structure 130. The window 130 may include at least a portion of a cap wafer 140 that is transmissive to infrared radiation. For MEMS based microbolometers, this packaging may be performed at the wafer level. In one example of the manufacturing process for such a device, the cap wafer 140 for covering the sensor element is formed from a semiconductor wafer. The fixing of the cap wafer 140 to the ROIC wafer 120 may be performed after the sensor elements (e.g., pixel array 120) are formed on the ROIC wafer. A dicing process may be performed after the cap is fixed to the wafer to produce individual devices. An example of such an individual device is shown in FIG. 1.

As shown in FIG. 1, the cap wafer 140 may be coated with an anti-reflective (AR) coating 150. Window areas are formed from recesses 160 that are etched into the cap wafer 140 and correspond with areas of the cap wafer that are covered with the AR coating 150. The recessed region 160 of the cap wafer 140 is positioned over the pixel array 110 and bonded to the ROIC wafer 120 using solder bonds 170, for example, to create an enclosed and sealed environment.

As used herein, the terms "lid wafer" and "cap wafer" are used interchangeably and refer to a wafer comprising at least one recess that is suitable for use with a device wafer comprising one or more devices, such as MEMS devices. As used herein, the term "recess" refers to a structure that can be described as a cavity within the wafer material that does not actually extend through the wafer. In some examples the cap wafer 140 is attached to the device wafer 120 in such a way as to form a hermetically sealed environment within the recess 160 covering the pixel array 110. The recessed area 160 may include one or more layers of an optically transmissive material. In such a configuration, the cap wafer 140 provides an optically transmissive window 130 above the pixel array 110.

The optically transmissive window 130 may be constructed from or coated with optically transmissive material that allows one or more wavelengths of energy in the electromagnetic spectrum to pass through the window. For example, the material may be optically transmissive in the visible spectrum, the IR spectrum, or both. Examples of non-silicon-based materials that are optically transmissive in both the visible spectrum and the IR spectrum include, but are not limited to zinc selenide, zinc sulfide, sapphire materials, etc. Such materials may be employed in the practice of the disclosed systems and methods as cap wafer materials for packaging or vacuum-packaging multi-band integrated FPA devices that are capable of detecting both IR spectrum radiation and visible spectrum radiation.

As discussed above, at least a portion of the cap wafer 140 may be coated with an AR coating 150. AR coatings may include a thin layer of dielectric material, with a selected thickness so that interference effects in the coating cause the wave reflected from the top surface of the AR coating to be out of phase with the wave reflected from an underlying semiconductor surface. The out-of-phase reflected waves destructively interfere with one another, resulting in substantially zero net reflected energy. AR coating 150 may be any material that is suitable for the purposes of performing an anti-reflective function as described in the methods and systems disclosed herein. For example, the AR coating may comprise germanium or ZnS. In certain embodiments AR coating 150 may be an IR-transmitting material. The thickness of AR coating 150 may depend on the desired wavelength and bandpass for a specific application. For example, the thickness of AR coating 150 may be chosen so that the wavelength in the dielectric material is one quarter the wavelength of the incoming wave. Depending on the application, the thickness of AR coating 150 may range from several hundred Angstroms to several thousand Angstroms. In certain embodiments, AR coating may be deposited in separate layers, where each layer may range in thickness from several hundred Angstroms to several thousand Angstroms.

Figure 2A:
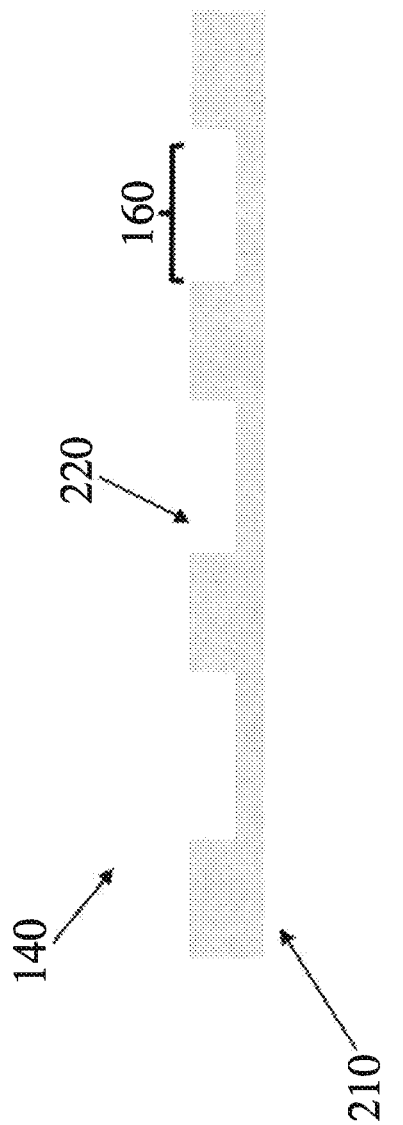
FIG. 2A is a diagram of a side cross-sectional view of an uncoated cap wafer in a configuration in accordance with aspects of the invention.

FIG. 2A illustrates an example of an uncoated cap wafer 140 having a planar side 210 and an opposing cavity side 220. As shown in FIG. 2, the cavity side 220 includes one or more recesses 160. In many applications, it is desirable to coat the recesses 160 of the cavity side 220 as well as the planar side 210 of the cap wafer 140 with one or more thin films, including thin films made from AR materials.

Stress in thin films may result from differences in thermal expansion (thermal stress) or from the microstructure of the deposited film (intrinsic stress). As used herein, the term "internal stress," when used in reference to a thin film, may refer to any one of thermal stress, intrinsic stress, tensile stress, and compressive stress. Thermal stress may occur because film depositions are usually made above room temperature. Upon cooling from the deposition temperature to room temperature, the difference in the thermal expansion coefficients of the substrate and the film cause thermal stress. Intrinsic stress results from the microstructure created in the film as atoms are deposited on the substrate. Tensile stress results from microvoids in the thin film because of the attractive interaction of atoms across the voids. The film wants to be "smaller" than the substrate because it was "stretched" to fit. Compressive stress results when heavy ions or energetic particles strike the film during deposition. The impacts are like hitting the film with a hammer, packing the atoms more tightly. The film wants to be "larger" than the substrate, because it was "compressed" to fit.

Figure 2B:
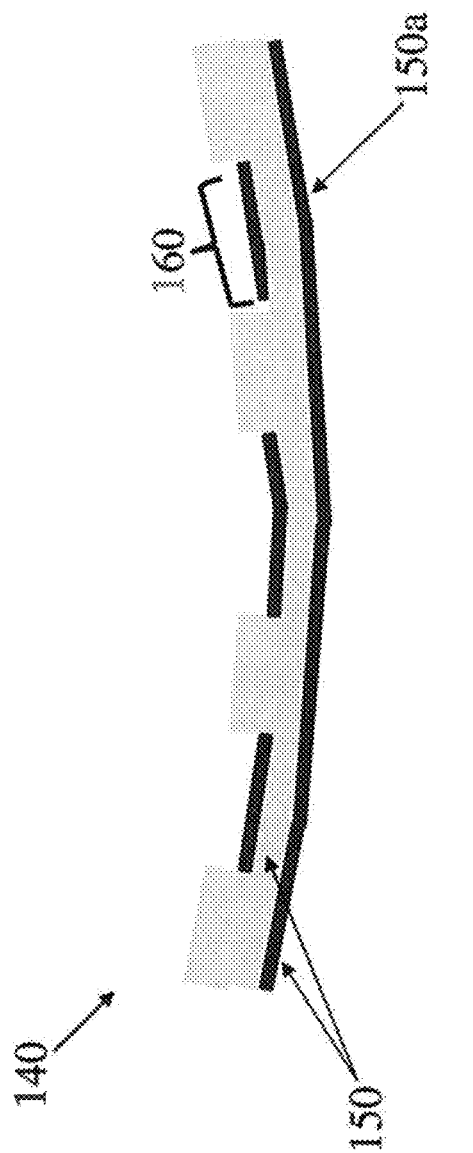
FIG. 2B is a diagram of a side cross-sectional view of a cap wafer coated using a traditional method.

FIG. 2B illustrates an example of a cap wafer 140 that has been coated on the cavity side and planar side with a thin film, such as an AR coating 150, using traditional coating methods. As shown in FIG. 2B, the planar side includes a continuous coating of AR material 150a, and the cavity side includes a coating of material only within the recesses 160. This configuration results in internal stress within the AR coatings to be unbalanced, and as shown in FIG. 2B, this imbalance causes the wafer to bow.

In certain instances, the internal stress in the AR coating 150 may induce from about 60 to over 100 microns of bowing. The bowing may interfere with multiple processing steps. For example, the bowing may result in non-uniform polishing off of the AR coating on the cavity side (if a polish-off process is utilized), hinder proper alignment between the cap wafer and the device wafer, prevent complete thermal contact with heater chucks or other associated structure, and interfere with the wafer level bonding process.

According to at least one embodiment, the problem of wafer bow induced by an AR coating may be addressed by providing a discontinuous AR coating to the planar side of the cap wafer, as shown FIG. 2C. In the illustrated example, the coating 230 on the planar side 210 is discontinuous, or segmented. On the cavity side 220 of the cap wafer 140, a coating 240 is disposed in the recesses 160. The cavity side 220 of the cap wafer 140 includes the recessed regions 160 separated from one another by uncoated dividing regions 270. The segmentation of the coating 230 on the planar side 210 alleviates internal stress in the coating and subsequently reduces or eliminates wafer bow. The discontinuous coating 230 may form a pattern, for example, where areas defined by one or more layers of coating material are separated from each other by areas that are not covered by coating material. In one embodiment, the pattern of the discontinuous coating 230 corresponds to a pattern on the recesses of the cavity side 220 of the cap wafer 140, such that portions of the coatings on either side of the cap wafer overlie one another. This is illustrated in FIG. 2C. At least one of the coatings 230 and 240 may be AR coatings, as discussed above. Although FIG. 2C illustrates coatings 230 and 240 on both sides of the cap wafer 140, it is to be appreciated that in other embodiments the discontinuous coating 230 may be formed on the planar side 210 of the cap wafer without a coating on the cavity side 220.

Figure 3:
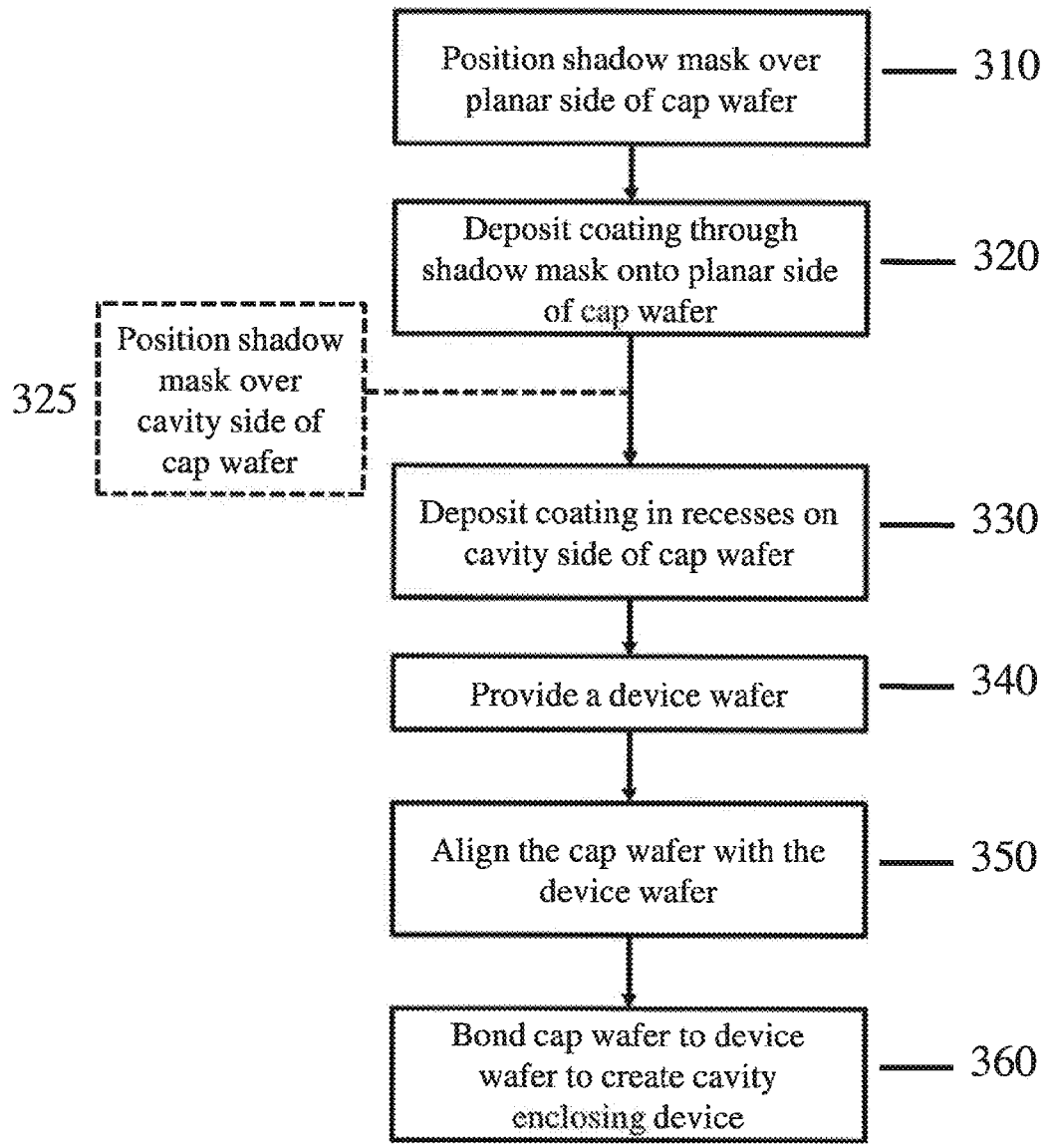
FIG. 3 is a flow chart of a method of reducing wafer bow in accordance with aspects of the invention.

In at least one embodiment, a method of reducing wafer bow in a cap wafer 140 includes depositing the discontinuous coating 230 using a shadow mask. Referring to FIG. 3, in at least one embodiment the method comprises positioning a shadow mask over the planar side of the cap wafer (step 310). The shadow mask may comprise at least one opening and may be aligned such that the at least one opening is positioned opposite at least one recessed region 160 on the cavity side 220 of the cap wafer 140. The method may further comprise depositing (step 320) at least one layer of a coating material through the shadow mask onto the planar side 210 of the cap wafer 140. As discussed above, in certain examples the coating material is an AR coating material. This deposition through the shadow mask creates the discontinuous coating 230 on the planar side 210 of cap wafer 140, as shown in FIG. 2C. As a result of the discontinuous coating 230, the planar side 210 of the cap wafer includes exposed regions 260 (that are then covered by the coating material) and masked regions 250 where no coating material is deposited. As discussed above, in certain embodiments, the exposed regions 260 on the planar side 210 correspond to or are at least partially aligned with the recessed regions 160 on the cavity side 220. Accordingly, the masked regions 250 on the planar side 210 may be at least partially aligned with the dividing regions 270 on the cavity side 220.

As used herein, the term "shadow mask" refers to a planar material with a predetermined pattern of one or more holes that allow exposure to a desired specific region of one or more substrates. In certain embodiments, the shadow mask may be a thin metal plate with a plurality of holes or apertures. The plurality of holes may be of any shape or size. For example, the holes may be square in shape, with a length of about one cm on each side. The space between the square holes may be from about one to about five mm. The material used to construct the shadow mask may be any material suitable for the purposes of performing a masking function as described in the methods disclosed herein. For example, the shadow mask may be constructed from stainless steel or other materials of the stainless steel family, such as Kovar® (a trademark of Carpenter Technology Corporation, Wyomissig, Pa.). In certain embodiments, the shadow mask may be constructed from a grid of wires. The shadow mask may be from about 0.1 to about 1.0 mm thick. The shadow mask may lay on the surface or be supported and positioned at a predetermined distance from the surface of the substrate.

According to at least one embodiment, the openings in the shadow mask may be dimensioned to extend appreciably beyond recessed regions 160 on the cap wafer 140. Accordingly, the exposed regions 260 on the planar side 210 of the cap wafer, which are covered by the discontinuous coating 230, at least partially overlap the dividing regions 270, as shown in FIG. 2C. Thus, the exposed regions 260, corresponding to the discontinuous coating 230 form a repeated pattern across the planar surface 210 of the cap wafer 140, separated from one another by the masked regions 250 corresponding to "gaps" 280 in the coating 230. According to one embodiment, the gaps 280 may correspond to saw streets in the wafer, along which the wafer may be cut or "diced" to produce individual devices, such as that shown in FIG. 1.

Figure 4:
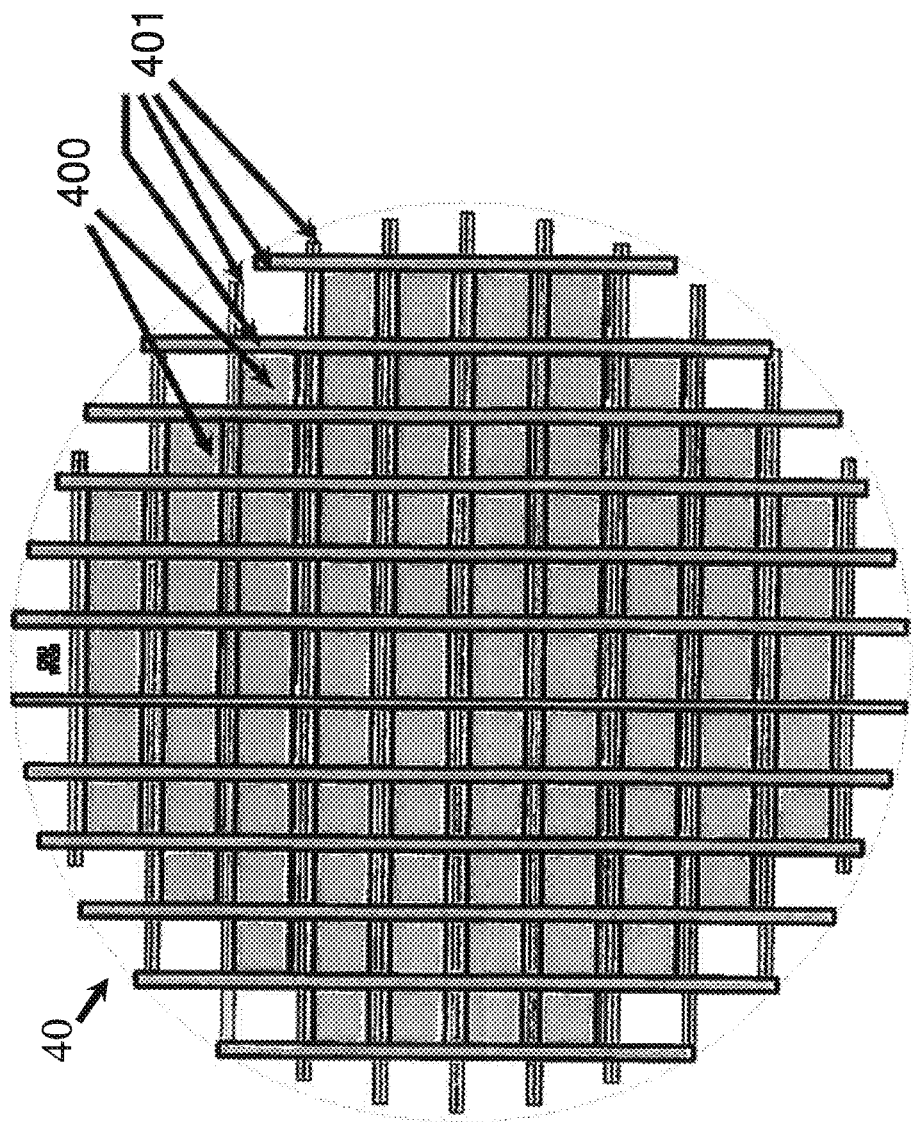
FIG. 4 is a diagram illustrating an example of a cap wafer in accordance with aspects of the invention.

Referring to FIG. 4, there is illustrated an example of a wafer 40 including multiple devices 400, which are represented by individual squares. The multiple devices 400 may form a repeated pattern across the surface of the wafer 40 and may be separated from one another by saw streets 401. During the dicing process the saw streets 401 define where the wafer is cut into the individual devices. Typically, the saw streets 401 are wide enough to allow for safe cutting of the wafer 40 without damaging the devices 400. In the example of the wafer 40 being the cap wafer 140 discussed above, the individual devices may correspond to the recesses 160. As discussed above, the saw streets may correspond, at least in part, to the gaps 280 in the discontinuous coating 230 and dividing regions 270 of the cap wafer.

In at least one embodiment, the discontinuous coating that corresponds to the at least one recessed region is dimensioned and configured so that the wafer bow induced by the coating is less than 30 microns for an 8 inch diameter cap wafer. According to a further embodiment, the wafer bow may be less than 20 microns.

Referring again to FIG. 3, in certain embodiments, the method may further comprise a step 330 of depositing a coating material, such as an AR coating, in the recessed regions 160 on the cavity side 220 of the cap wafer 140, as is also shown in FIG. 2C and discussed above. In some examples, deposition step 330 may also be accomplished using a shadow mask that is positioned over the cavity side 220 with openings aligned with the recesses 160. This is exemplified in step 325 of the figure. In other examples, the deposition step 330 may occur without using a shadow mask. The coated surface on the cavity side may subsequently be polished off (referred to herein as polish-off) so that the AR material is present only in the recessed regions 160. In certain embodiments, the discontinuous coating 230 on the planar side 210 of the cap wafer 140 is dimensioned and configured such that a wafer bow tending to be induced by the coating is counteracted by wafer bow tending to be induced by the coating 240 on the cavity side 220. As a result, the overall net induced wafer bow may be substantially zero.

It will be appreciated by those skilled in the art, given the benefit of this disclosure, that although the methods described above indicate that the planar side 210 of the cap wafer 140 is coated with the discontinuous coating 230 first, in other embodiments the coating 240 may be applied to the cavity side 220 before the discontinuous coating 230 is applied to the planar side 210. Alternatively, both the cavity side 220 and the planar side 210 of the cap wafer 140 may be coated at the same time.

In certain aspects, the method may further comprise providing a device wafer (step 340). In various aspects, the method may comprise providing a device wafer onto which at least one MEMS device is formed. The MEMS device may be provided as discussed and described above. The cap wafer may be positioned over and aligned with the device wafer such that the cavity side of the cap wafer is facing the at least one MEMS device, and the recessed region is positioned over the at least one MEMS device (step 350). The cap wafer may then be bonded to the device wafer (step 360) to provide a cavity enclosing a device, such as the pixel array 110 as shown in FIG. 1. Bonding may be performed by any one of the methods recognized by one of ordinary skill in the art and suitable for the purposes of the methods disclosed herein.

As discussed above, FIG. 1 illustrates a MEMS device, such as an FPA, formed onto an ROIC wafer 120 and covered with a cap wafer 140 that is bonded to the surface of the ROIC wafer. As shown in FIG. 1 and discussed above, in one embodiment the recessed region 160 on the cavity side of the cap wafer 140 and the exposed region from the shadow mask processing step on the planar side of the cap wafer each include an AR coating. In at least one example, the dimensions of the AR coating on the planar side of the cap wafer correspond with both the recessed region on the cavity side of the cap wafer and the pixel array of the MEMS device on the ROIC wafer.

Figure 5:
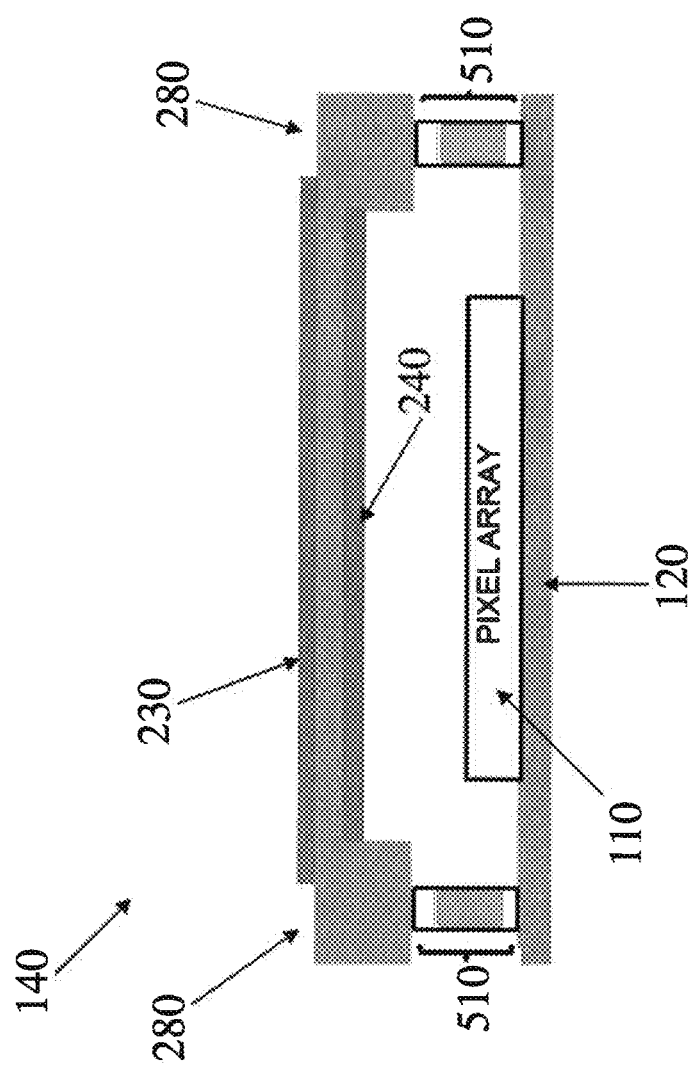
FIG. 5 is a diagram illustrating a side cross-sectional view of a portion of a cap wafer bonded to a portion of a device wafer in accordance with aspects of the invention.

Referring to FIG. 5, in some embodiments, bonding the cap wafer 140 to the device wafer 120 creates bonding structures 510. In certain embodiments, the bonding structures 510 may be bond lines. According to at least one embodiment, the bonding structures 510 may be inspected through the gaps 280 provided by the discontinuous coating 230 on the planar side of the cap wafer 140. In various embodiments, the bonding structures 510 may be optically inspected. An optical inspection may be performed by a digital camera. In at least one embodiment, the inspection may be performed using a charge-coupled device (CCD). In another embodiment, the inspection may be performed using near infrared (NIR) microscopy. In further embodiments, the bonding structures 510 may be optically inspected as an in-situ process step.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Accordingly, the foregoing description and drawings are by way of example only, and the scope of the invention should be determined from proper construction of the appended claims, and their equivalents.

What is claimed is:

1. A method of reducing wafer bow induced by an anti-reflective coating on a cap wafer, the method comprising:
    providing the cap wafer having a planar side and an opposing cavity side, the cavity side including at least one recessed region and a dividing region on either side of the at least one recessed region;
    positioning a first shadow mask having at least one opening therein over the planar side of the cap wafer, the at least one opening dimensioned to extend beyond the at least one recessed region on the cap wafer;

aligning the first shadow mask such that the at least one opening is positioned opposite the at least one recessed region; and depositing at least one layer of an anti-reflective coating material through the first shadow mask onto the planar side of the cap wafer to provide a discontinuous coating on the planar side, the discontinuous coating dimensioned and configured such that a wafer bow induced by the anti-reflective coating is less than 30 microns for an 8 inch diameter cap wafer.

2. The method of claim 1, wherein the wafer bow is less than 20 microns.

3. The method of claim 1, wherein the at least one recessed region corresponds to the location of at least one micro-electromechanical system (MEMS) device on a corresponding device wafer.

4. The method of claim 1, wherein the discontinuous coating corresponds to saw streets on the cap wafer.

5. The method of claim 1, further comprising positioning a second shadow mask having at least one opening therein over the cavity side of the cap wafer and aligning the second shadow mask such that the at least one opening is positioned over the at least one recessed region.

6. The method of claim 5, further comprising depositing at least one layer of an anti-reflective coating material through the at least one opening in the second shadow mask onto the cavity side of the cap wafer to provide a discontinuous coating on the cavity side.

7. The method of claim 6, wherein the discontinuous coating on the planar side is dimensioned and configured such that a wafer bow induced by the anti-reflective coating is in balance with a wafer bow induced by the anti-reflective coating on the cavity side.

8. The method of claim 7, further comprising providing a device wafer onto which at least one MEMS device is formed.

9. The method of claim 8, further comprising:

positioning the cap wafer over the device wafer such that the cavity side of the cap wafer is facing the at least one MEMS device;

aligning the cap wafer to the device wafer such that the at least one recessed region is positioned over the at least one MEMS device; and bonding the cap wafer to the device wafer to create bonding structures.

10. The method of claim 9, further comprising inspecting the bonding structures through inspection regions provided by the discontinuous coating on the planar side of the cap wafer.

11. The method of claim 10, wherein the inspection is performed using a charge-coupled device (CCD).

* * * * *